United States Patent
Kerber et al.

(10) Patent No.: US 9,640,552 B2
(45) Date of Patent: May 2, 2017

(54) MULTI-HEIGHT FIN FIELD EFFECT TRANSISTORS

(71) Applicant: International Business Machines Corporation, Armonk, NY (US)

(72) Inventors: Pranita Kerber, Mount Kisco, NY (US); Carl J. Radens, LaGrangeville, NY (US); Sudesh Saroop, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 175 days.

(21) Appl. No.: 14/519,596

(22) Filed: Oct. 21, 2014

(65) Prior Publication Data
US 2015/0287809 A1 Oct. 8, 2015

Related U.S. Application Data

(63) Continuation of application No. 14/243,398, filed on Apr. 2, 2014.

(51) Int. Cl.
| | |
|---|---|
| *H01L 27/12* | (2006.01) |
| *H01L 21/84* | (2006.01) |
| *H01L 21/02* | (2006.01) |
| *H01L 21/311* | (2006.01) |
| *H01L 29/66* | (2006.01) |

(52) U.S. Cl.
CPC .... *H01L 27/1207* (2013.01); *H01L 21/02532* (2013.01); *H01L 21/02598* (2013.01); *H01L 21/31144* (2013.01); *H01L 21/845* (2013.01); *H01L 29/66795* (2013.01)

(58) Field of Classification Search
CPC .............. H01L 21/823487; H01L 21/823885
See application file for complete search history.

(56) References Cited

U.S. PATENT DOCUMENTS

| | | | |
|---|---|---|---|
| 7,709,303 B2 | 5/2010 | Burnett et al. | |
| 7,781,273 B2 | 8/2010 | Schepis et al. | |
| 7,888,192 B2 | 2/2011 | Marshall et al. | |
| 8,116,121 B2 | 2/2012 | Kawasaki | |
| 8,361,894 B1 | 1/2013 | Hargrove et al. | |
| 2009/0207667 A1* | 8/2009 | Park ..................... | G11C 8/14 365/185.33 |

(Continued)

FOREIGN PATENT DOCUMENTS

EP 1620891 B1 8/2008

*Primary Examiner* — Mohammad Choudhry
(74) *Attorney, Agent, or Firm* — Scully Scott Murphy and Presser; Frank DiGiglio

(57) ABSTRACT

Semiconductor fins are formed on a top surface of a substrate. A dielectric material is deposited on the top surfaces of the semiconductor fins and the substrate by an anisotropic deposition. A dielectric material layer on the top surface of the substrate is patterned so that the remaining portion of the dielectric material layer laterally surrounds each bottom portion of at least one semiconductor fin, while not contacting at least one second semiconductor fin. Dielectric material portions on the top surfaces of the semiconductor fins may be optionally removed. Each first semiconductor fin has a lesser channel height than the at least one second semiconductor fin. The first and second semiconductor fins can be employed to provide fin field effect transistors having different channel heights.

15 Claims, 15 Drawing Sheets

(56) References Cited

U.S. PATENT DOCUMENTS

2010/0038679 A1\* 2/2010 Chan ................ H01L 29/66795
  257/190
2011/0042744 A1\* 2/2011 Cheng ............... H01L 29/66795
  257/347

\* cited by examiner

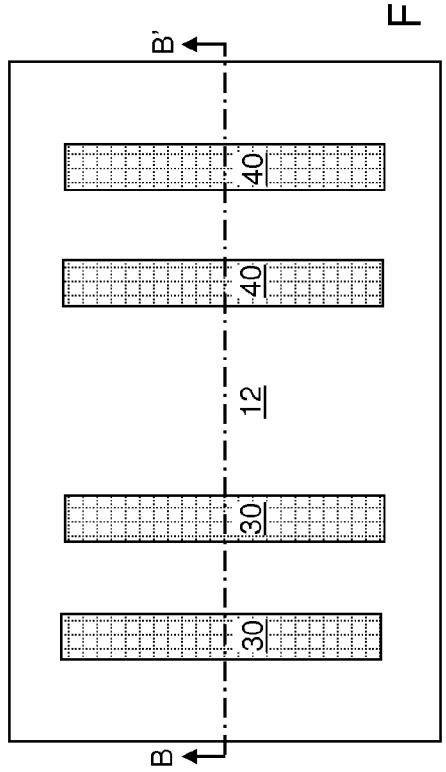
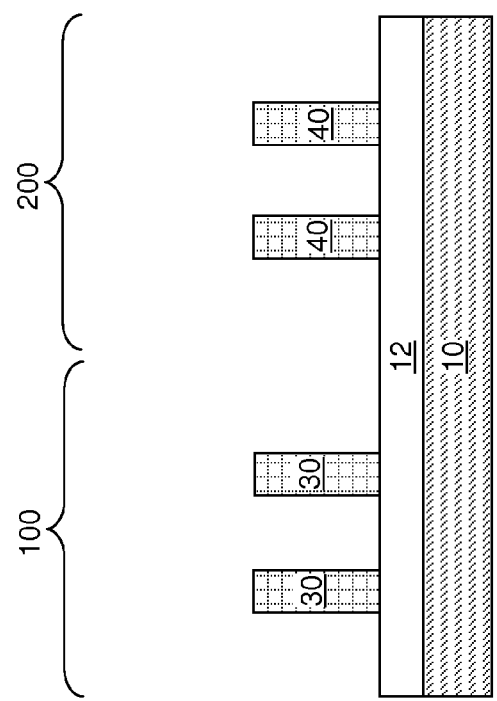

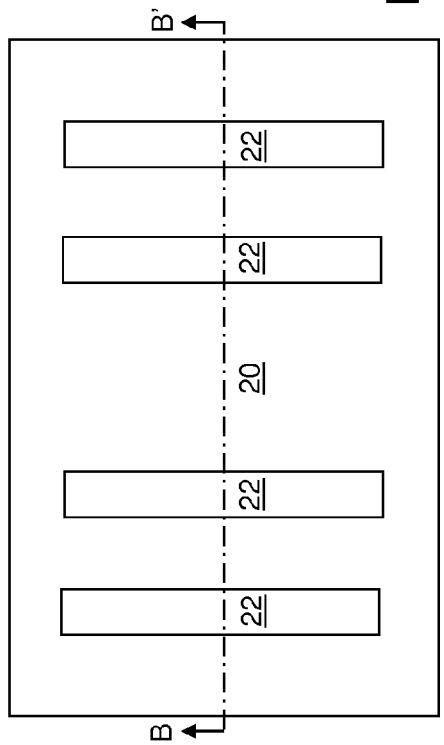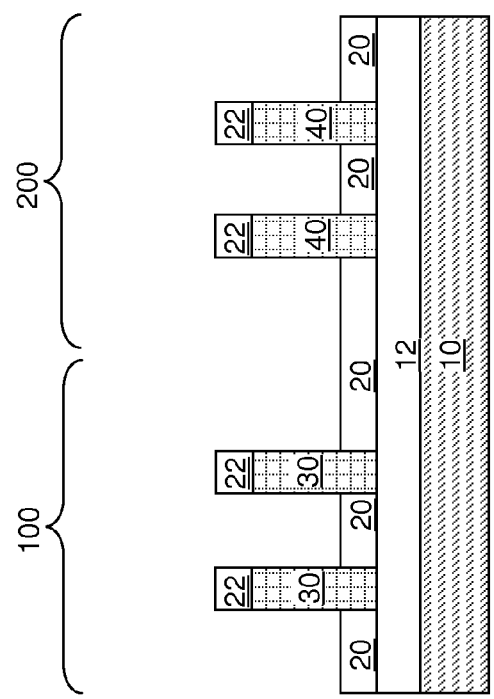

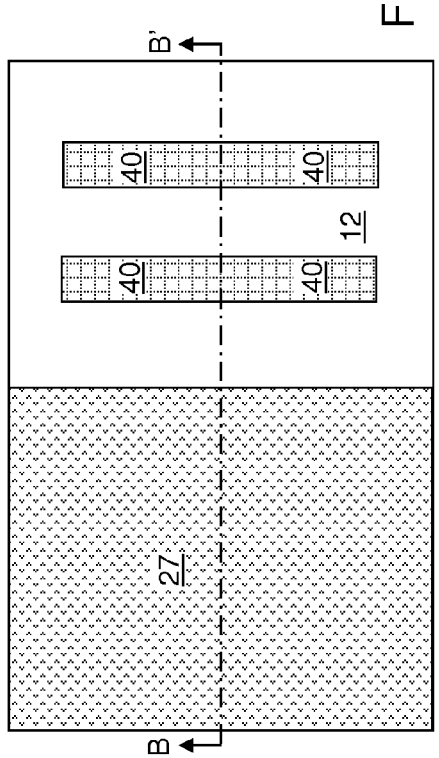
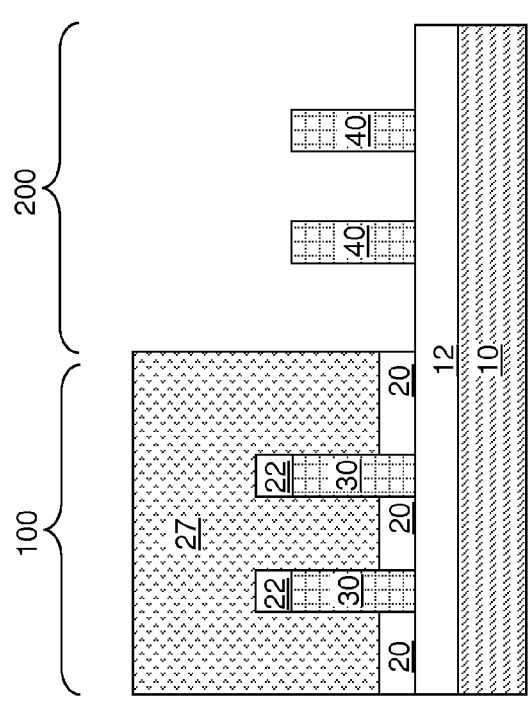

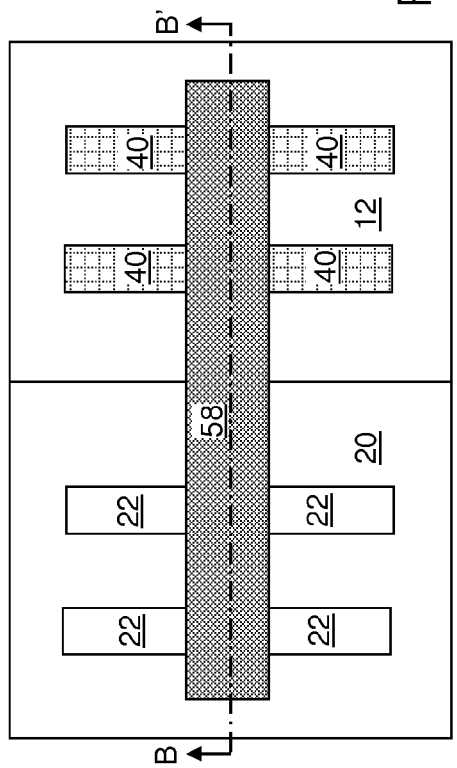
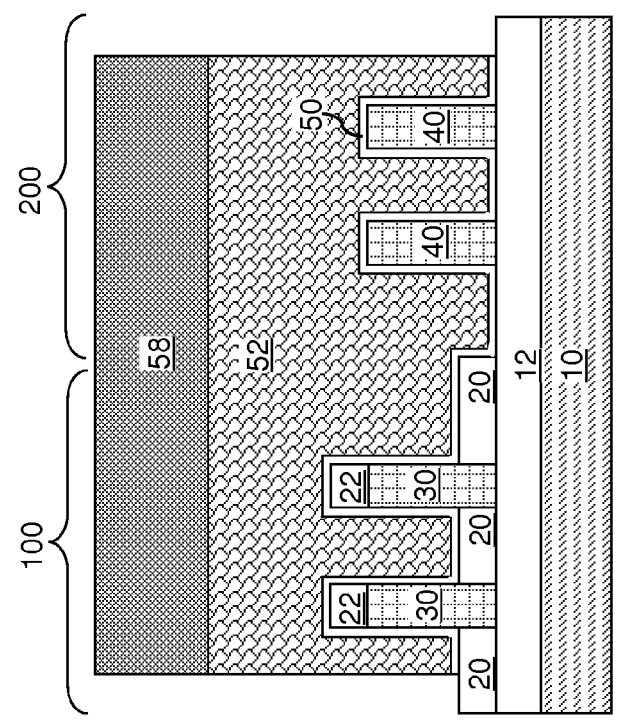
FIG. 4A
FIG. 4B

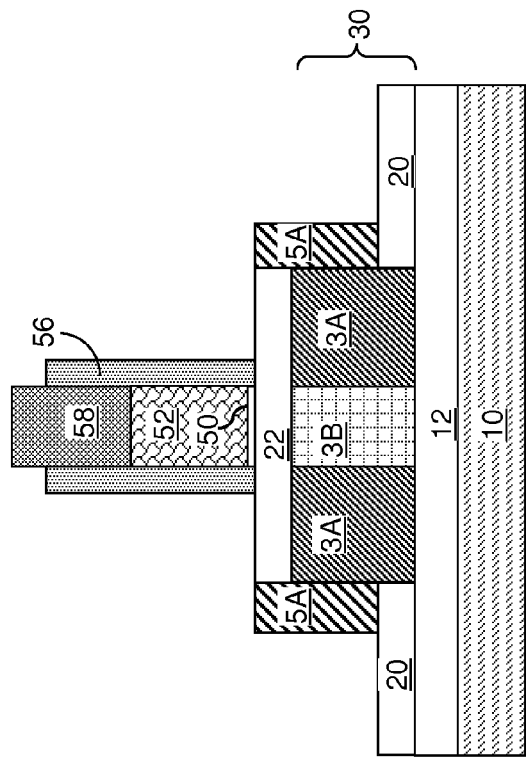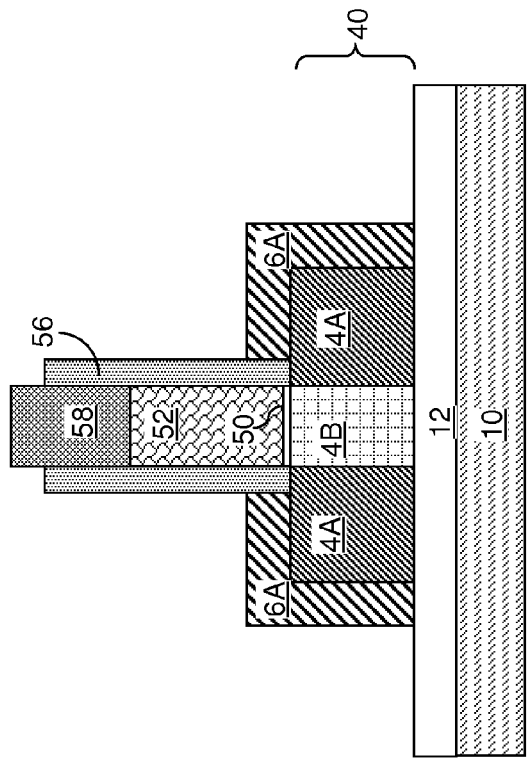

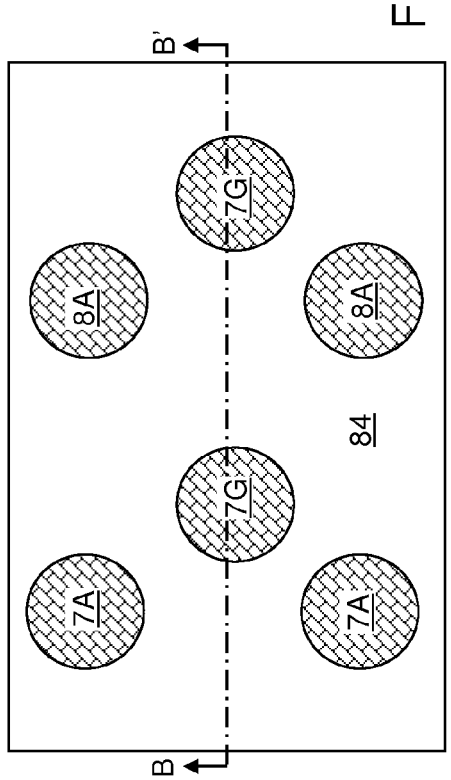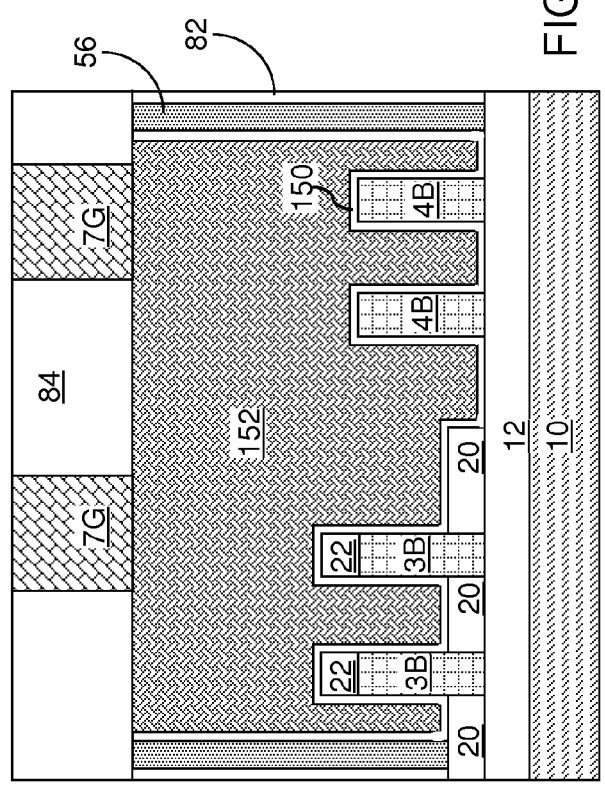

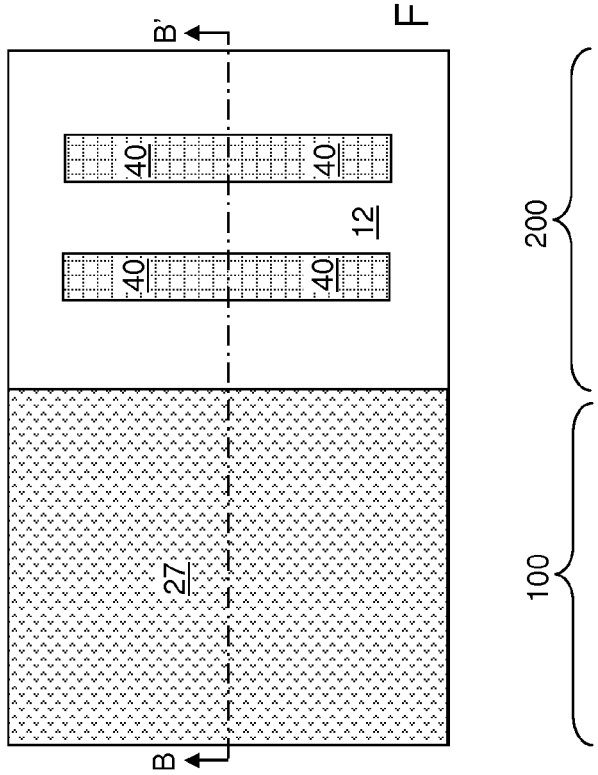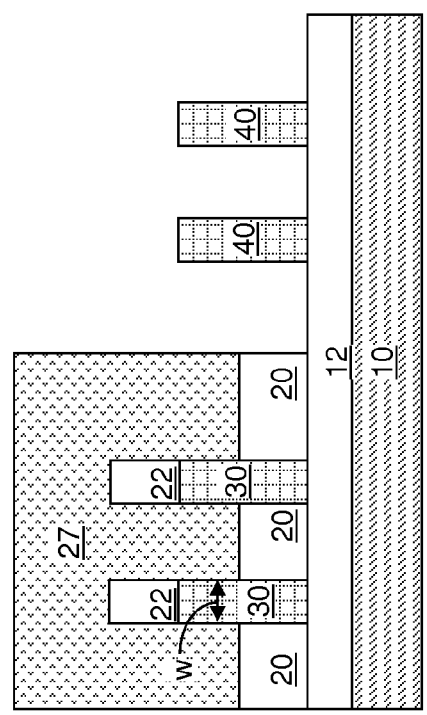

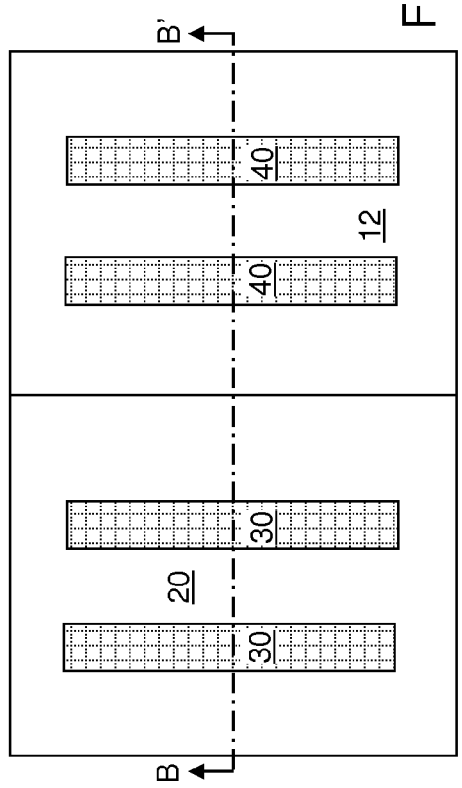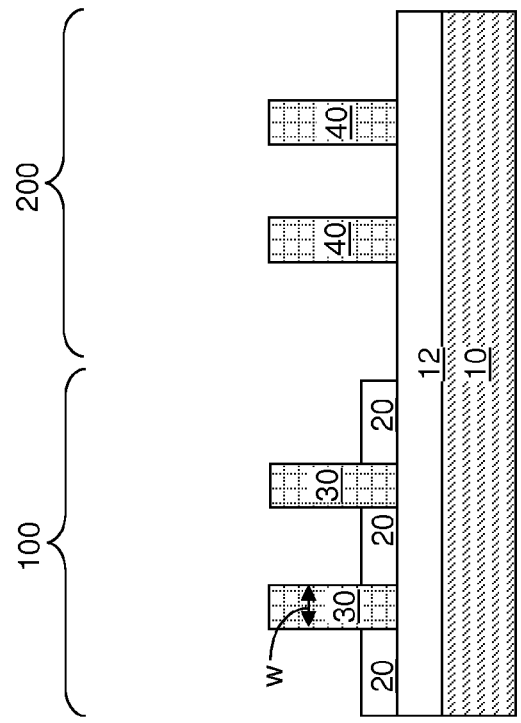

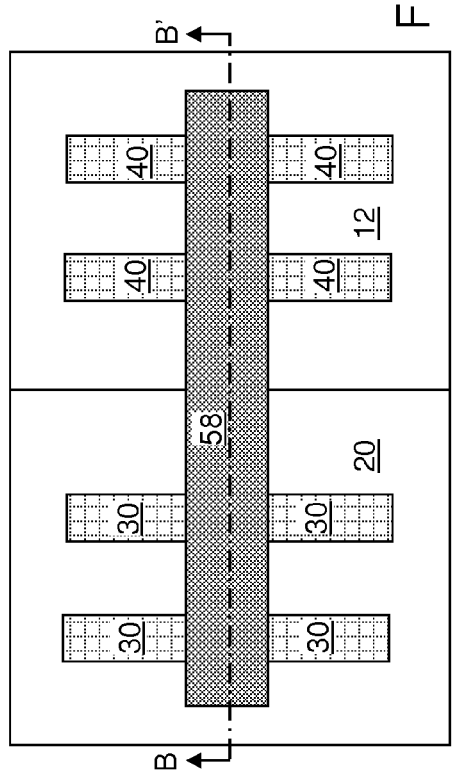
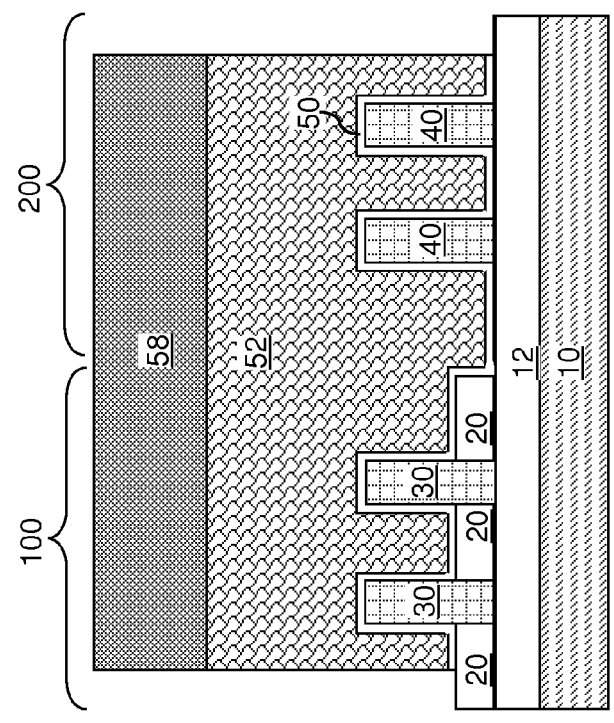

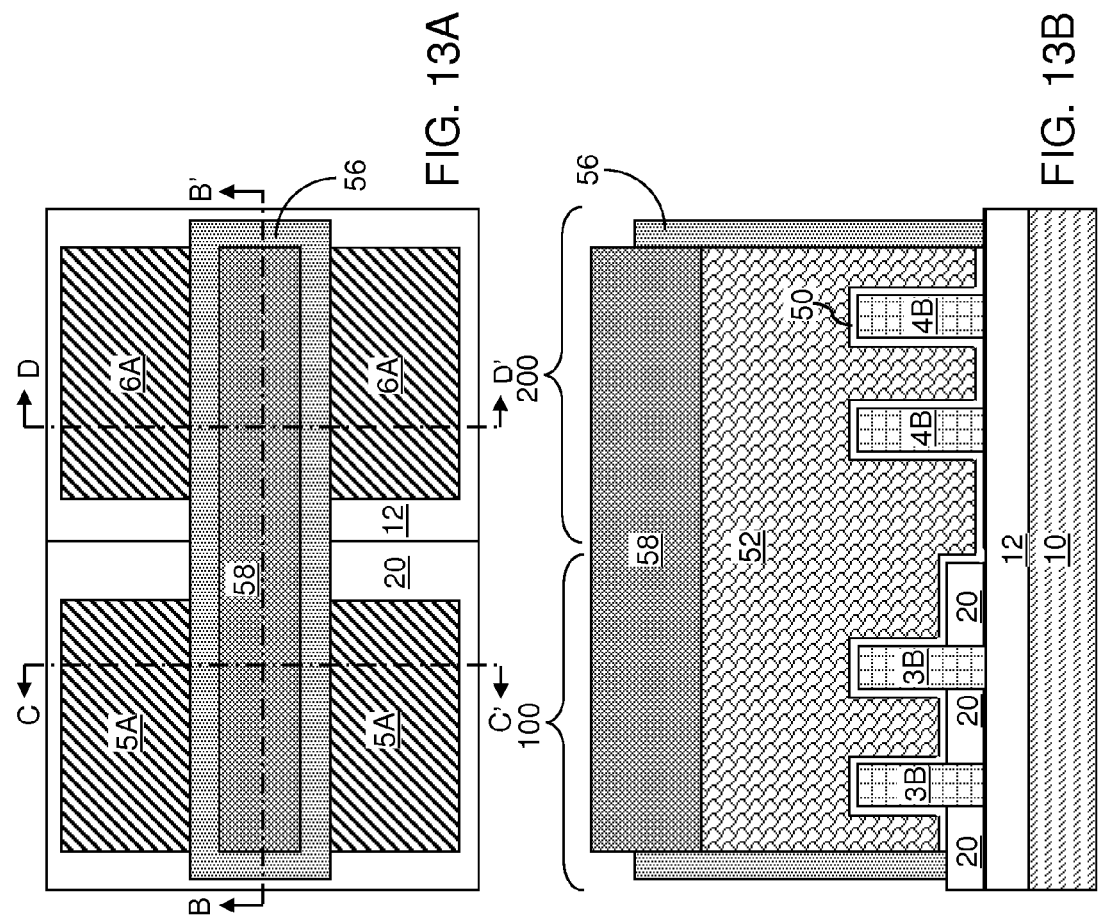

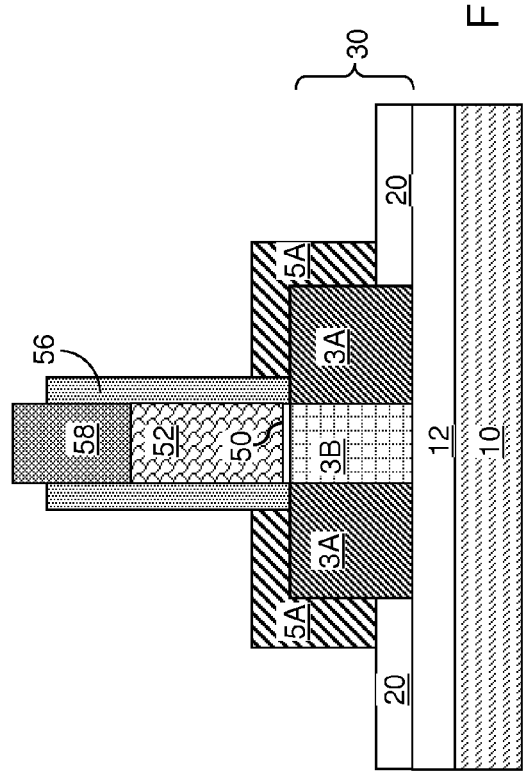
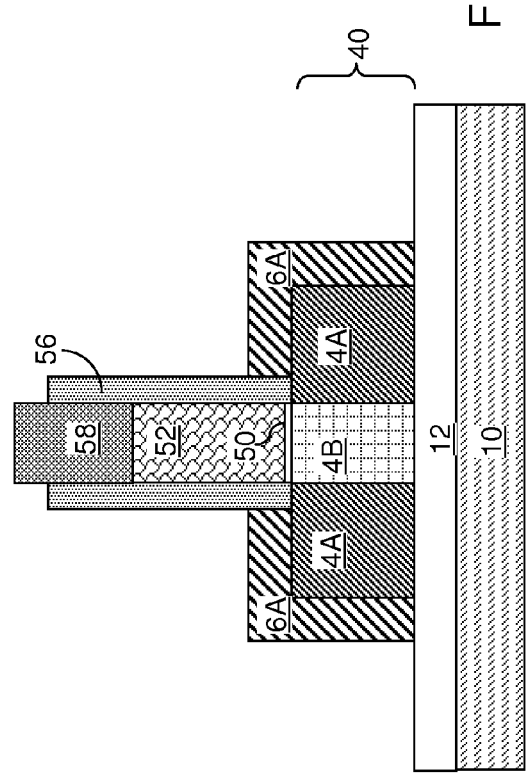

MULTI-HEIGHT FIN FIELD EFFECT TRANSISTORS

BACKGROUND

The present disclosure relates to a semiconductor structure, and more particularly to fin field effect transistors including semiconductor fins having different channel widths, and a method of manufacturing the same.

A finFET is field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

In conventional semiconductor fin devices, the height of semiconductor fins is fixed, and the output of the semiconductor fin devices is controlled by the number of semiconductor fins within each semiconductor fin device. For example, the on-current of a fin field effect transistor is digitally changed by changing the total number of semiconductor fins within the fin field effect transistor, while the semiconductor fins have the same height. As a result, the output of conventional semiconductor fin devices on a same substrate is quantized, and incremental adjustment of the output by an amount less than the output from a single semiconductor fin is difficult to achieve.

SUMMARY

Semiconductor fins are formed on a top surface of a substrate. A dielectric material is deposited on the top surfaces of the semiconductor fins and the substrate by an anisotropic deposition. A dielectric material layer on the top surface of the substrate is patterned so that the remaining portion of the dielectric material layer laterally surrounds each bottom portion of at least one semiconductor fin, while not contacting at least one second semiconductor fin. Dielectric material portions on the top surfaces of the semiconductor fins may be optionally removed. Each first semiconductor fin has a lesser channel height than the at least one second semiconductor fin. The first and second semiconductor fins can be employed to provide fin field effect transistors having different channel heights.

According to an aspect of the present disclosure, a semiconductor structure includes a first semiconductor fin and a second semiconductor fin that are located on a substrate, a dielectric material layer located on the substrate and contacting, and laterally surrounding, a lower portion of the first semiconductor fin, and at least one gate dielectric including a first gate dielectric portion straddling the first semiconductor fin and a second gate dielectric portion straddling the second semiconductor fin. The first gate dielectric portion contacts a top surface of the dielectric material layer and sidewalls of the first semiconductor fin, and the second gate dielectric portion contacts a top surface of the substrate and sidewalls of the second semiconductor fin.

According to another aspect of the present disclosure, a method of forming a semiconductor structure is provided. Semiconductor fins are formed on a substrate. The semiconductor fins include a first semiconductor fin formed in a first device region and a second semiconductor fin formed in a second device region. A dielectric material is anisotropically deposited on the substrate and the first and second semiconductor fins. The dielectric material is removed from the second device region, while the dielectric material is protected under a mask layer in the first device region. The mask layer is removed. At least one gate structure is formed across the first and second semiconductor fins.

BRIEF DESCRIPTION OF SEVERAL VIEWS OF THE DRAWINGS

FIG. 1A is a top-down view of a first exemplary semiconductor structure after formation of a plurality of semiconductor fins according to a first embodiment of the present disclosure.

FIG. 1B is a vertical cross-sectional view of the first exemplary semiconductor structure along the vertical plane B-B' in FIG. 1A.

FIG. 2A is a top-down view of the first exemplary semiconductor structure after anisotropic deposition of a dielectric material according to the first embodiment of the present disclosure.

FIG. 2B is a vertical cross-sectional view of the first exemplary semiconductor structure along the vertical plane B-B' in FIG. 2A.

FIG. 3A is a top-down view of the first exemplary semiconductor structure after removal of deposited dielectric material structures from a second device region while a first device region is covered with a patterned mask layer according to the first embodiment of the present disclosure.

FIG. 3B is a vertical cross-sectional view of the first exemplary semiconductor structure along the vertical plane B-B' in FIG. 3A.

FIG. 4A is a top-down view of the first exemplary semiconductor structure after formation of a gate structure according to the first embodiment of the present disclosure.

FIG. 4B is a vertical cross-sectional view of the first exemplary semiconductor structure along the vertical plane B-B' in FIG. 4A.

FIG. 5C is a vertical cross-sectional view of the first exemplary semiconductor structure along the vertical plane C-C' in FIG. 5A.

FIG. 5D is a vertical cross-sectional view of the first exemplary semiconductor structure along the vertical plane D-D' in FIG. 5A.

FIG. 8A is a top-down view of a second variation of the first exemplary semiconductor structure according to the first embodiment of the present disclosure.

FIG. 8B is a vertical cross-sectional view of the second variation of the first exemplary semiconductor structure along the vertical plane B-B' in FIG. 8A.

FIG. 10A is a top-down view of a second exemplary semiconductor structure after removal of deposited dielectric material structures from a second device region while a first device region is covered with a patterned mask layer according to the second embodiment of the present disclosure.

FIG. 10B is a vertical cross-sectional view of the second exemplary semiconductor structure along the vertical plane B-B' in FIG. 10A.

FIG. 11A is a top-down view of the second exemplary semiconductor structure after an isotropic etch that recesses a dielectric material layer in the first device region according to the second embodiment of the present disclosure.

FIG. 11B is a vertical cross-sectional view of the second exemplary semiconductor structure along the vertical plane B-B' in FIG. 11A.

FIG. 12A is a top-down view of the second exemplary semiconductor structure after formation of a gate structure according to the second embodiment of the present disclosure.

FIG. 12B is a vertical cross-sectional view of the second exemplary semiconductor structure along the vertical plane B-B' in FIG. 12A.

FIG. 13A is a top-down view of the second exemplary semiconductor structure after formation of raised active regions according to the second embodiment of the present disclosure.

FIG. 13B is a vertical cross-sectional view of the second exemplary semiconductor structure along the vertical plane B-B' in FIG. 13A.

FIG. 13C is a vertical cross-sectional view of the second exemplary semiconductor structure along the vertical plane C-C' in FIG. 13A.

FIG. 13D is a vertical cross-sectional view of the second exemplary semiconductor structure along the vertical plane D-D' in FIG. 13A.

DETAILED DESCRIPTION

Figures 5A, 5B:
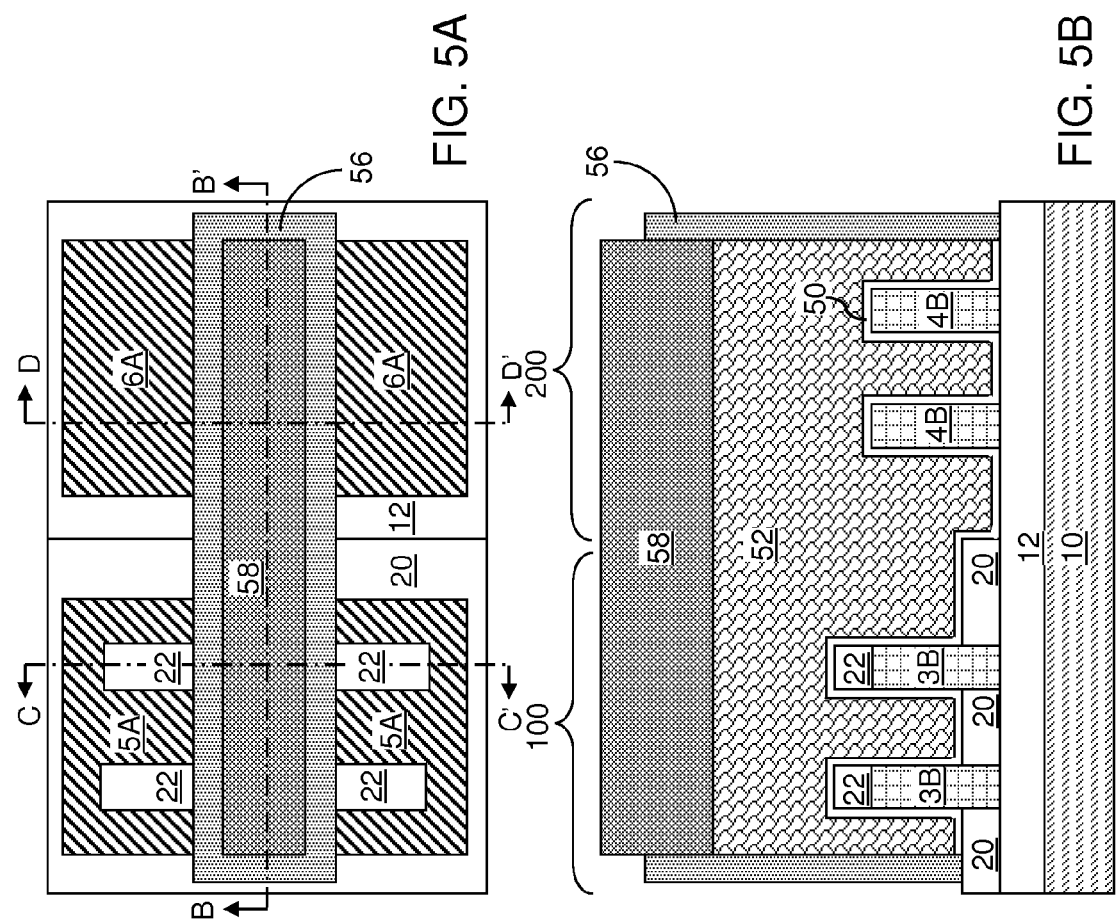
FIG. 5A is a top-down view of the first exemplary semiconductor structure after formation of raised active regions according to the first embodiment of the present disclosure.
FIG. 5B is a vertical cross-sectional view of the first exemplary semiconductor structure along the vertical plane B-B' in FIG. 5A.

As stated above, the present disclosure relates fin field effect transistors including semiconductor fins having different channel widths, and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A and 1B, a first exemplary semiconductor structure according to a first embodiment of the present disclosure includes semiconductor fins (30, 40) formed on a top surface of a substrate (10, 12). As used herein, a "semiconductor fin" refers to a semiconductor material portion having a pair of parallel sidewalls. The direction about which the moment of inertia of a semiconductor fin is at a minimum is herein referred to as a "lengthwise direction" of the semiconductor fin.

The semiconductor fins (30, 40) include at least one first semiconductor fin 30 formed in a first device region 100 and at least one second semiconductor fin 40 formed in a second device region 200. The at least one semiconductor fin 30 and the at least one second semiconductor fin 40 can have a same semiconductor material, or can have different semiconductor materials. In one embodiment, substrate (10, 12) can be a vertical stack including a handle substrate 10 and a buried insulator layer 12, and the semiconductor fins (30, 40) can be formed by patterning a top semiconductor layer of a semiconductor-on-insulator (SOI) substrate including the buried insulator layer 20 and the handle substrate 10. Alternatively, a bulk semiconductor substrate can be employed in lieu of an SOI substrate, and a top portion of the bulk semiconductor substrate can be patterned to provide semiconductor fins (30, 40). In this case, the substrate underlying the semiconductor fins (30, 40) can be unpatterned portions of the bulk semiconductor substrate.

Each of the semiconductor fins (30, 40) can include a single crystalline semiconductor material. The single crystalline semiconductor material can be, for example, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the single crystalline semiconductor material can include single crystalline silicon or a single crystalline alloy of silicon.

Optionally, dielectric fin caps (not shown) having the same horizontal cross-sectional area as underlying semiconductor fins (30, 40) may be formed on the top surface of each semiconductor fin 30, for example, by forming a dielectric material layer (not shown) above the single crystalline semiconductor layer prior to application of the photoresist layer, and by patterning the dielectric material layer through transfer of the pattern in the patterned photoresist layer into the dielectric material layer employing an anisotropic etch.

In one embodiment, the semiconductor fins (30, 40) may, or may not, be doped with p-type dopants or n-type dopants. The height of the semiconductor fins (30, 40) can be from 20 nm to 300 nm, although greater and lesser thicknesses can also be employed. The width of the semiconductor fins (30, 40) can be in a range from 3 nm to 100 nm, although lesser and greater widths can also be employed.

The semiconductor fins (30, 40) can be formed by patterning a semiconductor material layer located on a substrate. In one embodiment, the semiconductor material layer can be a top semiconductor layer of an SOI substrate. In another embodiment, the semiconductor material layer can be an upper portion of a bulk semiconductor substrate. In this case, all of the semiconductor fins (30, 40) can have the same height throughout. Top surfaces of the first semiconductor fins 30 and the second semiconductor fins 40 can be coplanar, i.e., located within a same horizontal plane. Further, bottom surfaces of the first semiconductor fins 30 and the second semiconductor fins 40 can be coplanar.

Referring to FIGS. 2A and 2B, a dielectric material is anisotropically deposited on horizontal top surfaces of the substrate (10, 12) and the semiconductor fins (30, 40). During the anisotropic deposition, no dielectric material, or less dielectric material, is deposited on vertical surfaces of the first exemplary semiconductor structure compared to the deposition of the dielectric material on horizontal surfaces. The anisotropic deposition of the dielectric material can be performed by physical vapor deposition (PVD), plasma enhanced chemical vapor deposition (PECVD), or another deposition method that is known to deposit more material on horizontal surfaces while depositing less material or no material on vertical surfaces.

The anisotropically deposited dielectric material can include silicon oxide, silicon oxynitride, silicon nitride, a dielectric metal oxide, a dielectric metal nitride, or a combination thereof. A dielectric material layer 20 is formed on the top surface of the substrate (10, 12) and dielectric material portions 22 are formed on top surfaces of the first and second semiconductor fins (30, 40) by the anisotropically deposited dielectric material.

In one embodiment, the dielectric material is not deposited on an upper portion of each sidewall of the first and second semiconductor fins (30, 40). Thus, sidewall surfaces of the semiconductor fins (30, 40) farther away from the top surface of the substrate (10, 12) by a distance greater than the thickness of the dielectric material layer 20 can remain physically exposed through the deposition process.

In another embodiment, the dielectric material can be collaterally deposited on an upper portion of each sidewall of the first and second semiconductor fins (30, 40). In this case, the upper portion of each sidewall of the first and second semiconductor fins (30, 40) can be physically exposed by an isotropic etch that removes the anisotropically deposited dielectric material. The isotropic etch can be, for example, a wet etch.

The thickness of the deposited dielectric material is selected such that the top surface of the dielectric material layer 20 after the anisotropic deposition process is formed below the horizontal plane including the horizontal surfaces of the semiconductor fins (30, 40). The thickness of the dielectric material layer 20 can be, for example, in a range from 5 nm to 100 nm, although lesser and greater thicknesses can also be employed. The bottom surface of the dielectric material layer 20 can be coplanar with the bottom surfaces of the semiconductor fins (30, 40). The thickness of the dielectric material portions 22 can be the same as the thickness of the dielectric material layer 20.

Referring to FIGS. 3A and 3B, a patterned mask layer 27 is formed over the dielectric material layer 20, and at least one first semiconductor fin 30, and the dielectric material portions 22 that are present in the first device region 100. The patterned mask layer 27 can be, for example, a patterned photoresist layer formed by application and lithographic patterning of a photoresist material. The area of the second device region 200 is not covered by the patterned mask layer 57. The deposited dielectric material structures (20, 22) in the second device region 200 are removed while the first device region 100 is covered with the patterned mask layer 27. The removal of the dielectric material layer 12 and the dielectric material portions 22 from the second device region 200 can be performed employing an etch process. The etch process can employ an isotropic etch such as a wet etch, or can employ an anisotropic etch such as a reactive ion etch. The removal of the dielectric material layer 12 and the dielectric material portions 22 is performed selective to the semiconductor material of the at least one second semiconductor fin 40. The removal of the dielectric material layer 12 and the dielectric material portions 22 can be selective, non-selective, or partially selective to the dielectric material of the buried insulator layer 12. The duration of the etch process can be selected such that the at least one second semiconductor fin 40 is attached to, and mechanically stable over, the substrate (10, 12). Subsequently, the patterned mask layer 27 can be removed, for example, by ashing.

Referring to FIGS. 4A and 4B, at least one gate structure (50, 52, 58) is formed across the first and second semiconductor fins (30, 40). The at least one gate structure (50, 52, 58) straddles the semiconductor fins (30, 40). In the first device region 100, the at least one gate structure (50, 52, 58) can be formed directly on the dielectric material layer 20L. In the second device region 200, the at least one gate structure (50, 52, 58) can be formed directly on the buried insulator layer 12. Each of the at least one gate structure (50, 52, 58) includes a vertical stack of a gate dielectric 50, a gate electrode 52, and an optional gate cap dielectric 58.

For example, a gate dielectric 50, a gate electrode 52, and an optional gate cap dielectric 58 can be formed over a middle portion of each semiconductor fin (30, 40) by deposition and patterning of a gate dielectric layer, a gate conductor layer, and an optional gate cap dielectric layer. In one embodiment, the gate dielectric layer can be formed conformally on the surfaces of the semiconductor fins (30, 40).

In one embodiment, the gate dielectric layer can include a dielectric material formed by thermal conversion of surface portions of the semiconductor fins (30, 40), such as silicon oxide or silicon nitride. Thermal oxidation, thermal nitridation, plasma oxidation, plasma nitridation, or a combination thereof may be employed to form the gate dielectric layer. In this case, the gate dielectric layer can be formed only on physically exposed surfaces of the semiconductor fins (30, 40).

Alternately or additionally, the gate dielectric layer may include a high-k dielectric material having a dielectric constant greater than 3.9, i.e., the dielectric constant of silicon oxide. The high-k dielectric material may comprise a dielectric metal oxide containing a metal and oxygen. In one embodiment, the dielectric constant of the high-k material is greater than or about 4.0. In one embodiment, the dielectric constant of the high-k dielectric material is greater than the dielectric constant of silicon nitride, which is about 7.5. In one embodiment, the dielectric constant of the high-k dielectric material is greater than 8.0. The high-k dielectric materials are also known in the art as high-k gate dielectric materials, which include dielectric metal oxides, alloys thereof, and silicate alloys thereof. Optionally, an interfacial layer (not shown), for example, silicon oxide, can be formed by chemical oxidation or thermal oxidation before the high-k dielectric material is deposited.

The gate conductor layer can be deposited on the gate dielectric layer, for example, by chemical vapor deposition (CVD). The gate conductor layer may comprise a doped semiconductor material or a metallic material. Non-limiting examples of the semiconductor materials include amorphous silicon, polysilicon, an amorphous silicon germanium alloy, or a polycrystalline silicon germanium alloy. Non-limiting examples of metallic materials include W, Ta, TiN, ZrN, HfN, VN, NbN, TaN, WN, TiAlN, TaC, TaMgC, TaCN, other conductive refractory metal nitrides, and an alloy thereof. The gate conductor layer may be formed by chemical vapor deposition (CVD), physical vapor deposition (PVD), atomic layer deposition (ALD), vacuum evaporation, etc. In one embodiment, the thickness of the gate conductor layer may be from 20 nm to 300 nm.

The gate cap dielectric layer can be formed by deposition of a dielectric material. In one embodiment, the dielectric material of the gate cap dielectric layer can be silicon nitride. The thickness of the gate cap dielectric layer can be in a range from 20 nm to 300 nm, although lesser and greater thicknesses can also be employed.

The stack of the gate dielectric layer, the gate conductor layer, and the gate cap dielectric layer can be lithographically patterned by application and patterning of a photoresist material, and by transfer of the pattern in the photoresist material into the stack. Employing the patterned photoresist as an etch mask, the anisotropic etch can remove the physically exposed portions of the gate cap dielectric layer and the gate conductor layer selective to the gate dielectric layer. The physically exposed portions of the gate dielectric layer can subsequently be removed selective to the semiconductor material of the semiconductor fins (30, 40), for example, by an isotropic etch such as a wet etch. A remaining portion of the gate cap dielectric layer constitutes a gate cap dielectric 58, a remaining portion of the gate conductor layer constitutes a gate electrode 52, and a remaining portion of the gate dielectric layer constitutes a gate dielectric 50. Each vertical stack of a gate dielectric 50, a gate electrode 52, and a gate cap dielectric 58 constitute a gate stack (50, 52, 58).

The at least one gate structure (50, 52, 58) contains at least one gate dielectric 50. The at least one gate structure (50, 52, 58) can be formed as a single contiguous gate structure, or can be formed as a plurality of gate structures. For example, a first gate structure can be formed in the first device region 100, and a second gate structure can be formed in the second device region 200. The at least one gate dielectric 50 includes a first gate dielectric portion straddling the at least one first semiconductor fin 30 and located in the first device region 100, and a second gate dielectric portion straddling the at least one second semiconductor fin 40 and located in the second device region 200.

The first exemplary semiconductor structure includes at least a first semiconductor fin 30 and a second semiconductor fin 40 that are located on a substrate (10, 12), a dielectric material layer 20 located on the substrate (10, 12) and contacting, and laterally surrounding, a lower portion of the first semiconductor fin 30, and at least one gate dielectric 50 including a first gate dielectric portion straddling the first semiconductor fin 30 and a second gate dielectric portion straddling the second semiconductor fin 40. The first and second semiconductor fins (30, 40) have the same height. The first gate dielectric portion contacts the top surface of the dielectric material layer 20, and the second gate dielectric portion contacts the top surface of the substrate (10, 12). In one embodiment, the first gate dielectric portion can be formed directly on sidewalls of the at least one first semiconductor fin 30, and the second gate dielectric portion can be formed directly on sidewalls of the at least one second semiconductor fin 40.

In one embodiment, an interface between the first semiconductor fin 30 and the first gate dielectric portion extends from the top surface of the dielectric material layer 20 to the top surface of the first semiconductor fin 30. An interface between the second semiconductor fin 40 and the second gate dielectric portion extends from the top surface of the substrate (10, 12) to the top surface of the second semiconductor fin 40.

A dielectric material portion contacts a top surface of the first semiconductor fin 30, wherein the second gate dielectric portion contacts a top surface of the second semiconductor fin 40. The dielectric material portions 22 and the dielectric material layer can have the same composition and the same thickness.

If the substrate (10, 20) includes a buried insulator layer 12, which is an insulator material layer, the buried insulator layer 12 can contact a bottom surface of the first semiconductor fin 30 and a bottom surface of the second semiconductor fin 40. A bottom surface of the first gate dielectric portion of the at least one gate dielectric 50 is spaced from the buried insulator layer 12 by the dielectric material layer 20, and a bottom surface of the second gate dielectric portion of the at least one gate dielectric 50 contacts the top surface of the buried insulator layer 12. In one embodiment, the first gate dielectric portion can contact the sidewalls and the top surface of the dielectric material portions 22, and the second gate dielectric portion can contact the top surface of the second semiconductor fin 40.

In one embodiment, the at least one gate dielectric 50 can be a single contiguous gate dielectric including the first gate dielectric portion and the second gate dielectric portion. In this case, the at least one gate electrode 52 can be a single contiguous gate electrode that contiguously extends over the first gate dielectric portion and the second gate dielectric portion.

Referring to FIGS. 5A-5D, a gate spacer 56 can be formed around each gate stack (50, 52, 58). The gate spacer 56 can be formed, for example, by depositing a conformal dielectric material layer and by anisotropically etching the conformal dielectric material layer by an anisotropic etch. The dielectric material of the gate spacer 56 can be silicon oxide, silicon nitride, silicon oxynitride, or a dielectric metal oxide. In one embodiment, the dielectric material of the gate spacer 56 can be different from the dielectric material of the dielectric material portions 22. For example, the dielectric material portions 22 can include silicon oxide, and the gate spacer 56 can include silicon nitride. The anisotropic etch recesses the portions of the conformal dielectric material layer located on sidewalls of the semiconductor fins (30, 40). The remaining vertical portions of the conformal dielectric material layer constitute the gate spacer 56. The width of the gate spacer 56 can be in a range from 3 nm to 100 nm, although lesser and greater widths can also be employed.

Optionally, fin active regions (3A, 4A) can be formed at this step by implantation of electrical dopants, which can be p-type dopants and/or n-type dopants, into physically exposed portions of the semiconductor fins (30, 40) prior to, or after, formation of the gate spacer 56. As used herein, an "active region" can be a source region or a drain region of a field effect transistor. As used herein, a "fin active region" refers to an active region located within a semiconductor fin. As used herein, a "fin source region" refers to a source region located within a semiconductor fin. As used herein, a "fin drain region" refers to a drain region located within a semiconductor fin. The fin active regions (3A, 4A) include first fin active regions 3A that are formed in the at least one first semiconductor fin 30, and second fin active regions 4A that are formed in the at least one second semiconductor fin 40. Each unimplanted portion of a first semiconductor fin 30 constitutes a first body region 3B, and each unimplanted portion of a second semiconductor fin 40 constitutes a second body region 4B.

Raised active regions (5A, 6A) can be formed on physically exposed semiconductor surfaces of the semiconductor fins (30, 40) by selective deposition of a semiconductor material. As used herein, a "raised active region" refers to an active region (i.e., a source region or a drain region) that is located on, and outside, a semiconductor fin or a preexisting semiconductor material portion. The raised active regions (5A, 6A) include first raised active regions 5A that are formed on the first fin active regions 3A, and second raised active regions 6A that are formed on the second fin active regions 4A. The selective deposition of the semiconductor material is performed while the dielectric material portions 22 are present on the top surfaces of each first semiconductor fins 30.

In one embodiment, the selective deposition of the semiconductor material can be performed by a selective epitaxy process. During the selective epitaxy process, the deposited semiconductor material grows from physically exposed semiconductor surfaces, i.e., the physically exposed portions of the lengthwise sidewalls and an end wall of each first fin active region 3A, and the physically portions of the lengthwise sidewalls, a top surface, and an end wall of each second fin active region 4A. As used herein, an end wall refers to a sidewall that is perpendicular to the lengthwise direction of a semiconductor fin. The semiconductor material does not grow from dielectric surfaces such as the surfaces of the dielectric material portions 22 and the shallow trench isolation layer 20.

In one embodiment, each portion of the raised active regions (5A, 6A) can be epitaxially aligned to an underlying semiconductor fin (30 or 40). The raised active regions (5A, 6A) can include the same semiconductor material as, or a semiconductor material different from, the semiconductor material of the semiconductor fins (30, 40).

The growth of the raised active regions (5A, 6A) can proceed with, or without, crystallographically faceted surfaces depending on the deposited semiconductor material and the deposition conditions. In one embodiment, the various semiconductor material portions of the raised active regions (5A, 6A) can be formed with crystallographic facets. The crystallographic facets of the raised active regions (5A, 6A) can be at a non-zero, non-orthogonal, angle with respect to adjoining surfaces of the raised active regions (5A, 6A).

In one embodiment, the selective epitaxy process can proceed until multiple semiconductor material portions grown from neighboring portions of semiconductor fins (30, 40) merge to form raised active regions (5A, 6A) such that at least one of the raised active regions (5A, 6A) contact multiple first fin active regions 3A or multiple second fin active regions 4A. The selective epitaxy process can be terminated when the sizes of the raised active regions (5A, 6A) reach a predetermined target, for example, by controlling the deposition conditions and the deposition time.

In one embodiment, the raised active regions (5A, 6A) can be formed with in-situ doping during the selective epitaxy process. Thus, each portion of the raised active regions (5A, 6A) can be formed as doped semiconductor material portions. Alternatively, the raised active regions (5A, 6A) can be formed by ex-situ doping. In this case, the raised active regions (5A, 6A) can be formed as intrinsic semiconductor material portions and electrical dopants can be subsequently introduced into the raised active regions (5A, 6A) to convert the raised active regions (5A, 6A) into doped semiconductor material portions.

If ex-situ doping is employed, ion implantation can provide electrical doping to portions of the semiconductor fins (30, 40) that do not underlie the gate structures (50, 52, 58). The ion implantation can provide additional electrical dopants in pre-existing fin active regions (3A, 4A). If fin active regions (3A, 4A) are not present prior to the ion implantation, fin active regions 3A can be formed by ion implantation, which converts the implanted portions of the semiconductor fins (30, 40) into the fin active regions (3A, 4A).

If in-situ doping is employed, an anneal process can be performed to outdiffuse the electrical dopants from the raised active regions (5A, 6A) into underlying portions of the semiconductor fins (30, 40) to provide additional electrical dopants to pre-existing fin active regions (3A, 4A), or, if fin active regions (3A, 4A) are not already formed, to convert portions of the semiconductor fins (30, 40) into fin active regions (3A, 4A).

After formation of the fin active regions (3A, 4A), each portion of the semiconductor fins (30, 40) that is not a fin active region (3A or 4A) constitutes a body region (3B, 4B). A p-n junction can be formed at the interfaces between each adjoining pair of a body region (3B, 4B) and a fin active region (3A, 4A).

Each first raised active region 5A includes a doped semiconductor material, contacts sidewalls of a dielectric material portion 22, and is epitaxially aligned to a single crystalline semiconductor material within a first semiconductor fin 30, which is the single crystalline semiconductor material of a fin source region 3A.

Figure 6A:
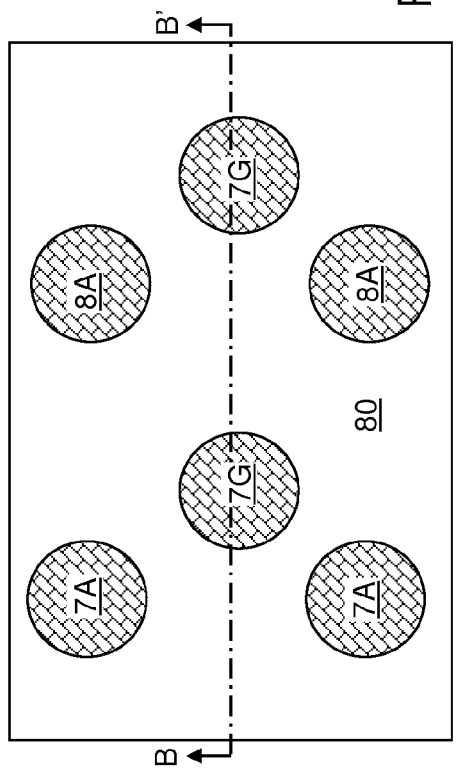
FIG. 6A is a top-down view of the first exemplary semiconductor structure after formation of a contact level dielectric layer and various contact via structures according to the first embodiment of the present disclosure.
Figure 6B:
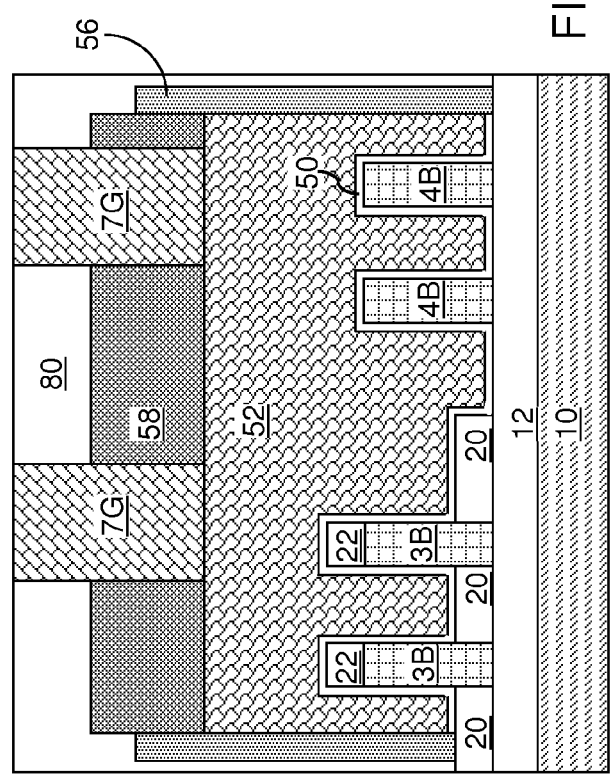
FIG. 6B is a vertical cross-sectional view of the first exemplary semiconductor structure along the vertical plane B-B' in FIG. 6A.

Referring to FIGS. 6A and 6B, a contact level dielectric layer 80 is formed over the at least one gate structure (50, 52, 58) and the raised active regions (5A, 5B). The contact level dielectric layer 80 includes a dielectric material such as silicon oxide, silicon nitride, organosilicate glass, or combinations thereof. Optionally, the top surface of the contact level dielectric layer 80 can be planarized.

Various contact via structures (7A, 8A, 7G) can be formed through the contact level dielectric layer to provide electrical contacts to the raised active regions (5A, 6A) and the at least one gate electrode 52. The various contact via structures (7A, 8A, 7G) can include first active region contact via structures 7A, second active region contact via structures 8A, and gate contact via structures 7G.

Figure 7A:
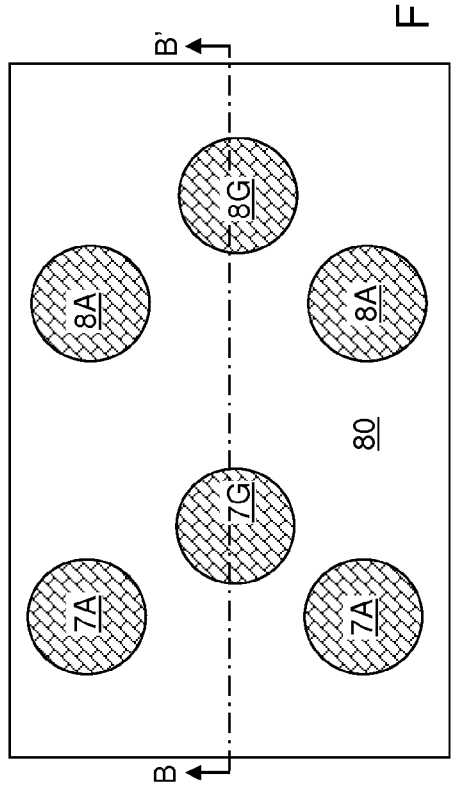
FIG. 7A is a top-down view of a first variation of the first exemplary semiconductor structure according to the first embodiment of the present disclosure.
Figure 7B:
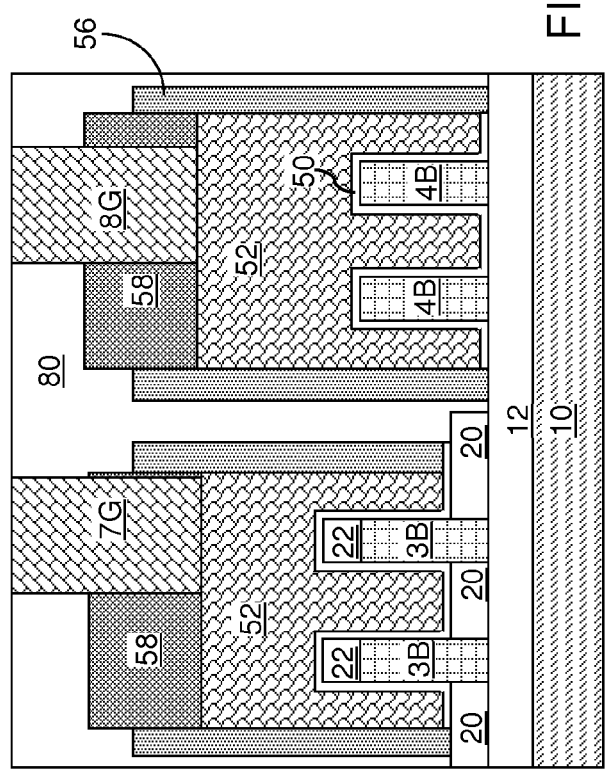
FIG. 7B is a vertical cross-sectional view of the first variation of the first exemplary semiconductor structure along the vertical plane B-B' in FIG. 7A.

Referring to FIGS. 7A and 7B, a first variation of the first exemplary semiconductor structure can be derived from the first exemplary semiconductor structure by forming multiple gate stacks (50, 52, 58) as the at least one gate stack (50, 52, 58) in lieu of a single gate stack (50, 52, 58) illustrated in FIGS. 4A and 4B. In this case, an additional gate contact via structure 8G can be formed through the contact level dielectric layer 80 to provide separate electrical contacts to the multiple gate electrodes 52.

Referring to FIGS. 8A and 8B, a second variation of the first exemplary semiconductor structure can be derived from the first exemplary semiconductor structure of FIGS. 5A-5D or a variation thereof by depositing a planarization dielectric layer 82 over the at least one gate structure (50, 52, 58) and the raised active regions (5A, 5B). The planarization dielectric layer 82 includes a dielectric material such as silicon oxide, silicon nitride, organosilicate glass, or combinations thereof. The top surface of the planarization dielectric layer 82 is planarized employing the top surface of the at least one gate structure (50, 52, 58) as a stopping surface.

Subsequently, the at least one gate structure (50, 52, 58) is replaced with at least one replacement gate structure (150, 152), each of which includes a gate dielectric 150 and a gate electrode 152. Methods known in the art can be formed to provide the at least one replacement gate structure (150, 152).

A contact level dielectric layer 84 is formed over the planarization dielectric layer 82 and the at least one replacement gate structure (150, 152). The contact level dielectric layer 84 includes a dielectric material such as silicon oxide, silicon nitride, organosilicate glass, or combinations thereof. Optionally, the top surface of the contact level dielectric layer 84 can be planarized.

Various contact via structures (7A, 8A, 7G) can be formed through the contact level dielectric layer 84 and the planarization dielectric layer 82 to provide electrical contacts to the raised active regions (5A, 6A) and the at least one gate electrode 152. The various contact via structures (7A, 8A, 7G) can include first active region contact via structures 7A, second active region contact via structures 8A, and gate contact via structures 7G.

Figure 9A:
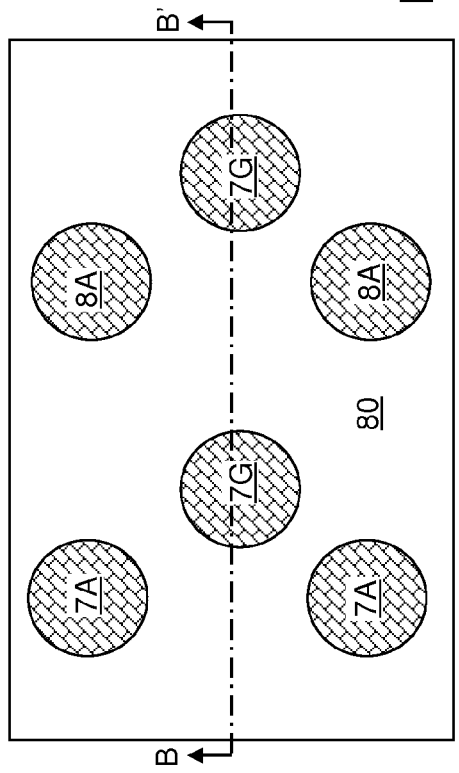
FIG. 9A is a top-down view of a third variation of the first exemplary semiconductor structure according to the first embodiment of the present disclosure.
Figure 9B:
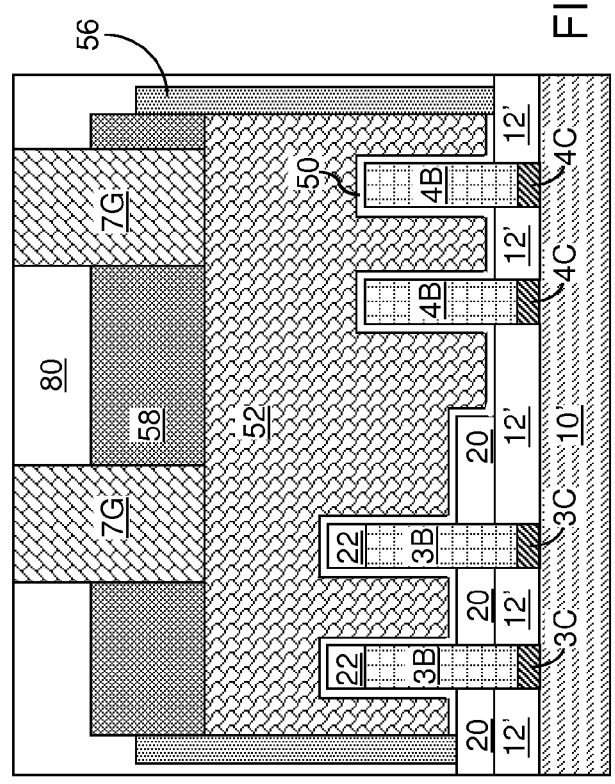
FIG. 9B is a vertical cross-sectional view of the third variation of the first exemplary semiconductor structure along the vertical plane B-B' in FIG. 9A.

Referring to FIGS. 9A and 9B, a third variation of the first exemplary semiconductor structure can be derived from the first exemplary semiconductor structure or a variation thereof by substituting a bulk semiconductor substrate in lieu of an SOI substrate. The upper portion of the bulk semiconductor substrate can be patterned to form at least one first semiconductor fin 30 (See FIGS. 1A and 1B) and at least one second semiconductor fin 40 (See FIGS. 1A and 1B). The remaining unpatterned lower portion of the bulk semiconductor substrate constitutes a semiconductor material layer 10'. The semiconductor fins (30, 40) can have the same properties as in the first exemplary semiconductor structure except that the semiconductor fins (30, 40) are formed on the semiconductor material layer 10'. The entirety of the semiconductor fins (30, 40) and the semiconductor material layer 10' can be single crystalline.

A shallow trench isolation layer 12', which is an insulator material layer, can be formed on the top surface of the semiconductor material layer 10' and around bottom portions of the semiconductor fins (30, 40). First channel stop regions 3C can be formed at the bottom portions of the at least one first semiconductor fin 30, and second channel stop portions 4C can be formed at the bottom portions of the at least one second semiconductor fin 40 by ion implantation. The channel stop regions (3C, 4C) are doped regions that provide electrical isolation of upper portions of the semiconductor fins (30, 40) from the semiconductor material layer 10'.

The processing steps of FIGS. 2A, 2B, 3A, 3B, 4A, 4B, 5A-5D, 6A, and 6B can be subsequently performed to provide the structure illustrated in FIGS. 9A and 9B.

Referring to FIGS. 10A and 10B, a second exemplary semiconductor structure can be provided in the same manner as in the first exemplary semiconductor structure illustrated in FIGS. 3A and 3B. In the second exemplary semiconductor structure, the thickness of the dielectric material portions 22 and the dielectric material layer 20 is selected to be greater than one half of the width w of the at least one first semiconductor fin 30. The deposited dielectric material structures (20, 22) are removed from the second device region 200 while the first device region 100 is covered with the patterned mask layer 27 in the same manner as in the first embodiment. The patterned mask layer 27 is removed, for example, by ashing.

Referring to FIGS. 11A and 11B, an isotropic etch is performed to remove the remaining dielectric material portions 22 and simultaneously recess the dielectric material layer 20. Each dielectric material portion 22 is etched from the sidewalls and from the top surface. The duration of the isotropic etch is selected such that the thickness of the etched dielectric material of the dielectric material portions 22 and the dielectric material layer 20 is greater than one half of the width of the at least one first semiconductor fin 30 (which is the width of the overlying dielectric material portion 22), and is less than the thickness of the dielectric material layer 20. In this case, all dielectric material portions 22 are removed by the isotropic etch, while a lower unetched portion of the dielectric material layer 20 remains after the isotropic etch. The isotropic etch can be, for example, a wet etch. For example, if the dielectric material layer 20 and the dielectric material portions 22 include silicon oxide, the isotropic etch can be a wet etch employing hydrofluoric acid.

Referring to FIGS. 12A and 12B, the processing steps of FIGS. 4A and 4B can be performed. The buried insulator layer 12, which is an insulator material layer, contacts sidewall surfaces of each first semiconductor fin 30 and sidewall surfaces of each second semiconductor fin 40. A bottom surface of the first gate dielectric portion of the at least one gate dielectric 52 is spaced from the buried insulator layer 12 by the dielectric material layer 20, and a bottom surface of the second gate dielectric portion of the at least one gate dielectric 52 contacts a top surface of the buried insulator layer 12.

The first gate dielectric portion of the at least one gate dielectric 52 contacts a top surface of the first semiconductor fin 30, and the second gate dielectric portion 40 of the at least one gate dielectric 52 contacts a top surface of a second semiconductor fin 40. In one embodiment, the at least one gate electrode 52 can be a single gate electrode that contiguously extends over the first gate dielectric portion and the second gate dielectric portion.

Referring to FIGS. 13A-13D, the processing steps of FIGS. 5A-5D can be performed as in the first embodiment. Subsequently, the processing steps of FIGS. 6A and 6B can be performed. In the second exemplary semiconductor structure, a bottom surface of each first raised active region 5A can contact a top surface of a first fin active region 3A.

The first and second semiconductor fins can have the same physical height. However, the exemplary structures of the present disclosure can provide different channel widths for semiconductor fins because each first semiconductor fin has a channel width that extends from the top surface of a dielectric material layer 20 to the top surface of the first semiconductor fin, while each second semiconductor fin has a channel width that is the same as the height of the second semiconductor fin. Further, the width of the top surface of the first semiconductor fin may, or may not, be added to the total channel width of the first semiconductor fin depending on the presence or absence of a dielectric material portion 22. The different channel widths of the semiconductor fins can advantageously be employed to provide fin field effect transistors having a finer granularity in the on-current.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure, said method comprising:
    forming semiconductor fins on a substrate, said semiconductor fins including a first semiconductor fin formed in a first device region and a second semiconductor fin formed in a second device region;
    anisotropically depositing a dielectric material on said substrate and said first and second semiconductor fins;
    removing said dielectric material from said second device region, while said dielectric material is protected under a mask layer in said first device region;
    removing said mask layer; and
    forming at least one gate structure across said first and second semiconductor fins, wherein a dielectric material layer is formed on a top surface of said substrate and dielectric material portions are formed on top surfaces of said first and second semiconductor fins by said anisotropically deposited dielectric material, and further comprising:

performing an isotropic etch on said dielectric material in said first device region after removing said mask layer, wherein all dielectric material portions in said first device region are removed by said isotropic etch, and a lower portion of said dielectric material layer remains after said isotropic etch.

2. The method of claim 1, wherein said dielectric material is not deposited on an upper portion of each sidewall of said first and second semiconductor fins.

3. The method of claim 1, wherein said dielectric material is collaterally deposited on an upper portion of each sidewall of said first and second semiconductor fins, and said method further comprises physically exposing said upper portion of each sidewall of said first and second semiconductor fins by an isotropic etch that removes said anisotropically deposited dielectric material.

4. The method of claim 1, wherein said at least one gate structure comprises at least one gate dielectric, said at least one gate dielectric including a first gate dielectric portion straddling said first semiconductor fin and a second gate dielectric portion straddling said second semiconductor fin, wherein said first gate dielectric portion contacts a top surface of said dielectric material layer, and said second gate dielectric portion contacts a top surface of said substrate.

5. The method of claim 4, wherein said first gate dielectric portion is formed directly on sidewalls of said first semiconductor fin, and said second gate dielectric portion is formed directly on sidewalls of said second semiconductor fin.

6. The method of claim 4, wherein said at least one gate structure further comprises a gate electrode, and a gate cap dielectric.

7. The method of claim 1, further comprising forming a gate spacer on an outer sidewall of said at least one gate structure by depositing a conformal dielectric material layer.

8. The method of claim 7, wherein said gate spacer is anisotropically etched to recess the topmost surface of said spacer below the topmost surface of said at least one gate structure.

9. The method of claim 8, wherein said gate spacer is comprised of a dielectric material selected from the group consisting of silicon oxide, silicon nitride, silicon oxynitride and a metal oxide.

10. The method of claim 1, wherein said first and second semiconductor fins are formed by patterning a semiconductor material layer located on said substrate.

11. The method of claim 1, wherein said substrate comprises a buried insulator layer and a handle substrate.

12. The method of claim 1, wherein said first semiconductor fin and said second semiconductor fin are comprised of the same semiconductor material.

13. The method of claim 12, wherein said semiconductor material is a single crystalline semiconductor material.

14. The semiconductor structure of claim 13, wherein said single crystalline semiconductor material comprises single crystalline silicon or a single crystalline alloy of silicon.

15. The method of claim 1, wherein said first semiconductor fin and said second semiconductor fin are comprised of different semiconductor materials.

* * * * *